United States Patent
Yoo et al.

(10) Patent No.: US 7,683,538 B2
(45) Date of Patent: Mar. 23, 2010

(54) DUAL PANEL-TYPE ORGANIC ELECTROLUMINESCENT DISPLAY DEVICE

(75) Inventors: Choong-Keun Yoo, Bupyeonggu (KR); Kwang-Yeon Lee, Gyeonggido (JP)

(73) Assignee: LG Display Co., Ltd., Seoul (KR)

( * ) Notice: Subject to any disclaimer, the term of this patent is extended or adjusted under 35 U.S.C. 154(b) by 818 days.

(21) Appl. No.: 11/158,115

(22) Filed: Jun. 21, 2005

(65) Prior Publication Data
US 2006/0061262 A1 Mar. 23, 2006

(30) Foreign Application Priority Data
Sep. 17, 2004 (KR) .................. 10-2004-0074393

(51) Int. Cl.
*H01J 1/62* (2006.01)
*H01J 63/04* (2006.01)

(52) U.S. Cl. ...................... 313/512; 313/506

(58) Field of Classification Search .............. None
See application file for complete search history.

(56) References Cited

U.S. PATENT DOCUMENTS

| | | |
|---|---|---|
| 5,276,380 A | 1/1994 | Tang |
| 5,294,869 A | 3/1994 | Tang et al. |
| 5,294,870 A | 3/1994 | Tang et al. |
| 5,701,055 A | 12/1997 | Nagayama et al. |
| 5,742,129 A | 4/1998 | Nagayama et al. |
| 5,952,037 A | 9/1999 | Nagayama et al. |
| 6,046,547 A | 4/2000 | Nishio et al. |
| 6,175,345 B1 | 1/2001 | Kuribayashi et al. |
| 6,373,455 B1 | 4/2002 | Kuribayashi et al. |
| 6,380,672 B1 * | 4/2002 | Yudasaka .................... 313/504 |
| 6,548,961 B2 | 4/2003 | Barth et al. |
| 6,919,680 B2 | 7/2005 | Shimoda et al. |

(Continued)

FOREIGN PATENT DOCUMENTS

CN 1509128 A 6/2004

(Continued)

OTHER PUBLICATIONS

Amorphous silicon driver circuits for organic light-emitting diode displays, P. Servati, S. Prakash, A. Nathan, and Christoph Py, J. Vac. Sci. Technol. A 20, 1374 (2002), DOI:10.1116/1.1486006.*

(Continued)

*Primary Examiner*—Toan Ton
*Assistant Examiner*—Britt D Hanley
(74) *Attorney, Agent, or Firm*—Brinks Hofer Gilson & Lione

(57) ABSTRACT

A dual panel-type organic electroluminescent display device includes a first substrate on which gate and data lines cross each other to define sub-pixels. Array elements are disposed at the sub-pixels on the first substrate. A first electrode is disposed on substantially the entire surface of a second substrate opposing the first substrate. An insulating pattern is disposed on the first electrode, an organic electroluminescent layer is disposed on the first electrode, and a second electrode is disposed on the organic electroluminescent layer at each sub-pixel. A connection pattern connects the array element and the second electrode at each sub-pixel. The connection pattern contacts the second electrode under the insulating pattern.

31 Claims, 10 Drawing Sheets

U.S. PATENT DOCUMENTS

| | | | |
|---|---|---|---|
| 7,106,282 B2 * | 9/2006 | Tanabe | 345/76 |
| 7,248,236 B2 * | 7/2007 | Nathan et al. | 345/76 |
| 2002/0195961 A1 | 12/2002 | Barth et al. | |
| 2004/0031959 A1 * | 2/2004 | Park et al. | 257/40 |
| 2004/0080262 A1 * | 4/2004 | Park et al. | 313/498 |
| 2004/0100191 A1 * | 5/2004 | Park | 313/506 |
| 2005/0140282 A1 * | 6/2005 | Park et al. | 313/505 |

FOREIGN PATENT DOCUMENTS

| | | |
|---|---|---|
| JP | 2001-117509 | 4/2001 |
| KR | 1020020047889 A | 6/2002 |
| WO | WO 02/078101 A1 | 10/2002 |

OTHER PUBLICATIONS

Office Action issued in corresponding Chinese Patent Application No. 200510082441.1; issued Aug. 1, 2008.

* cited by examiner

US 7,683,538 B2

DUAL PANEL-TYPE ORGANIC ELECTROLUMINESCENT DISPLAY DEVICE

The present invention claims the benefit of Korean Patent Application No. P2004-0074393 filed in Korea on Sep. 17, 2004, which is hereby incorporated by reference.

FIELD OF THE INVENTION

The present invention relates to an organic electroluminescent display device, and more particularly, to a dual panel-type organic electroluminescent display device and a method for manufacturing the same.

DISCUSSION OF THE RELATED ART

Among flat panel displays, liquid crystal display (LCD) devices have been commonly used due to their thin profile, light weight, and low power consumption. However, the LCD devices are not self-luminescent and suffer from low brightness, low contrast ratios, narrow viewing angles, and large overall sizes.

Organic electroluminescent display (OELD) devices have wide viewing angles and excellent contrast ratios because of their self-luminescence. In addition, since the OELD devices do not require additional light sources, such as a backlight, the OELD devices have relatively small sizes, are light weight, and have low power consumption, as compared the LCD devices. Furthermore, the OELD devices can be driven by low voltage direct current (DC) and have short microsecond response times. Since the OELD devices are solid state devices, the OELD devices sufficiently withstand external impact and have greater operational temperature ranges. In addition, the OELD devices may be manufactured at low cost since only deposition and encapsulation apparatus are necessary for manufacturing the OELD devices, thereby simplifying manufacturing processes.

The OELD devices are commonly categorized as top emission-type and bottom emission-type according to a direction of the emitted light. Furthermore, the OELD devices may be categorized as passive matrix-type OELD devices or active matrix-type OELD devices depending upon methods of driving the devices. The passive matrix-type OELD devices are commonly used because of their simplicity and ease of fabrication. However, the passive matrix-type OELD devices have scanning lines and signal lines that perpendicularly cross each other in a matrix configuration. Since a scanning voltage is sequentially supplied to the scanning lines to operate each pixel, an instantaneous brightness of each pixel during a selection period should reach a value resulting from multiplying an average brightness by the number of the scanning lines to obtain a required average brightness. Accordingly, as the number of the scanning lines increases, the applied voltage and current also increase. Thus, the passive matrix-type OELD devices are not adequate for high resolution display and large-sized displays since the devices easily deteriorate during use, and power consumption is high.

Since the passive matrix-type OELD devices have many disadvantages with regard to image resolution, power consumption, and operational lifetime, active matrix-type OELD devices have been developed to produce high image resolution in large area displays. In the active matrix-type OELD devices, thin film transistors (TFTs) are disposed at each sub-pixel to function as a switching element to turn each sub-pixel ON and OFF. Accordingly, a first electrode connected to the TFT is turned ON/OFF by the sub-pixel, and a second electrode facing the first electrode functions as a common electrode. In addition, a voltage supplied to the pixel is stored in a storage capacitor, thereby maintaining the voltage and driving the device until a voltage of next frame is supplied, regardless of the number of the scanning lines. As a result, since an equivalent brightness is obtained with a low applied current, an active matrix-type OELD device has low power consumption and high image resolution over a large area.

FIG. 1 is a schematic circuit diagram of a pixel structure for an active matrix-type OELD device according to the related art. In FIG. 1, a gate line GL is arranged along a first direction, and a data line DL and a power supply line CSL that are spaced apart from each other are arranged along a second direction perpendicular to the first direction. The data line DL and the power supply line CSL cross the gate line GL, thereby defining a sub-pixel area SP. A switching thin film transistor (TFT) SwT, i.e., an addressing element, is formed at a crossing of the gate line GL and the data line DL, and a storage capacitor CST is connected to the switching TFT SwT and the power supply line CSL. A driving thin film transistor (TFT) DrT, i.e., a current source element, is connected to the storage capacitor $C_{ST}$ and the power supply line CSL, and an organic electroluminescent (EL) diode E is connected to the driving TFT DrT.

When a forward current is supplied to the organic EL diode E, an electron and a hole are recombined to generate an electron-hole pair through the P(positive)-N(negative) junction between an anode, which provides the hole, and a cathode, which provides the electron. Since the electron-hole pair has an energy that is lower than the separated electron and hole, an energy difference exists between the recombination and the separated electron-hole pair, whereby light is emitted due to the energy difference.

FIG. 2 is a cross sectional view of a bottom emission-type organic electro-luminescent display (OELD) device according to the related art. In FIG. 2, first and second substrates 10 and 30 are spaced apart and are bonded together by a seal pattern 40. Each pixel P includes red, green, and blue sub-pixels SbP. A driving thin film transistor (TFT) DrT is formed at each sub-pixel SbP on an inner surface of the first substrate 10, and a first electrode 12 constituting an organic electroluminescent diode is connected to the TFT T. An organic electroluminescent layer 14 includes luminescent materials of red, green, and blue and is formed on the driving TFT DrT. In addition, a second electrode 16 is formed on the organic electroluminescent layer 14, whereby the first and second electrodes 12 and 16 induce an electric field to the organic electroluminescent layer 14.

A desiccant (not shown) is formed in an inner surface of the second substrate 30 to shield an internal portion of the OELD device from external moisture. The desiccant is attached to the second substrate 30 by an adhesive (not shown), such as semi-transparent tape.

In the bottom emission-type OELD device, for example, the first electrode 12 functions as an anode and is made of a transparent conductive material, and the second electrode 16 functions as a cathode and is made of a metallic material of low work function. Accordingly, the organic electroluminescent layer 14 is composed of a hole injection layer 14a, a hole transporting layer 14b, an emission layer 14c, and an electron transporting layer 14d formed over the first electrode 12. The emission layer 14c has a structure where emissive materials of red, green, and blue are alternately disposed at respective sub-pixels SbP.

FIG. 3 is a cross sectional view of a sub-pixel region of a bottom emission-type organic electroluminescent display device according to the related art. In FIG. 3, a thin film transistor area TrA, an emission area EmA and a storage capacitor area StgA are defined on a substrate 10. In the thin film transistor area TrA, a semiconductor layer 62, a gate insulating layer 63, a gate electrode 68, and source and drain electrodes 80 and 82 are sequentially formed. A storage capacitor and an organic electroluminescent (EL) diode E are connected to the source and drain electrodes 80 and 82, respectively. The storage capacitor is disposed in the storage capacitor area StgA, and the organic EL diode E is disposed in the emission area EmA. The storage capacitor includes a power electrode 72 and a capacitor electrode 64 that face each other with an insulating layer interposed between the power electrode 72 and the capacitor electrode 64. The capacitor electrode 64 is made of the same material as the semiconductor layer 62. The power electrode 72 extends from a power supply line (not shown). The thin film transistor and the storage capacitor are commonly referred to as array elements A. The organic EL diode E includes first and second electrodes 12 and 16 that face each other with an organic EL layer 14 interposed therebetween. The source electrode 80 of the thin film transistor is connected to the power electrode 72 of the storage capacitor, and the drain electrode 82 of the thin film transistor is connected to the first electrode 12 of the organic EL diode E. In addition, the array elements A and the organic EL diode E are formed on the same substrate 10.

The OELD device is fabricated through encapsulating the first substrate 10 including the array elements A and the organic EL diode E with the second substrate 30. In addition, a yield of the active matrix OELD device depends on individual yields of the thin film transistor and the organic EL diode E. Although the thin film transistor may adequately function, the yield of the active matrix OELD device varies due to the incorporation of impurities during the process of forming the organic layer. Accordingly, the yield of the active matrix OELD is reduced because of the impurities, and results in a loss of manufacturing costs and source materials.

In addition, the active matrix OELD device is a bottom emission-type device having high stability and variable degrees of freedom during the fabrication process, but has a reduced aperture ratio. Thus, the bottom emission-type active matrix OELD device is problematic in implementation as a high aperture device.

To overcome theses problems, a top emission-type active matrix OELD device, in which the array elements and the organic EL diode are formed on different substrates, has been suggested and developed.

FIG. 4 is a cross sectional view of a top emission-type active matrix OELD device of the related art, and FIG. 5 is an enlarged view of the region L of FIG. 4.

In FIGS. 4 and 5, first and second substrates 110 and 130 are spaced apart from each other and are bonded together by a seal pattern 140. Each pixel P includes three sub-pixels SbP. An array element 120 is formed at each sub-pixel SbP on the first substrate 110. The array element 120 formed at each sub-pixel sbP includes a driving thin film transistor (TFT) DrT and a connection electrode 112 connected to the driving TFT DrT. An organic EL diode E is formed on an inner surface of the second substrate 130 to correspond to each sub-pixel SbP. The organic EL diode E includes a first electrode 132 functioning as a common electrode, an organic EL layer 134 on the first electrode 132, and a second electrode 136 independently formed at each sub-pixel SbP. Additionally, a connection pattern 114 is formed between the second electrode 136 on the second substrate 130 and the connection electrode 112 on the first substrate 110 to electrically connect the second electrode 136 with the array element 120.

In the top emission-type OELD device where the organic EL diode E and the array element 120 are formed on different substrates, a process for attaching the first and second substrates 110 and 130 is performed under vacuum of about $10^{-2}$ Torr to about $10^{-3}$ Torr. The connection pattern 114 holds up the connection electrode 112 on the first substrate 110 and the second electrode 136 on the second substrate 130 under the above-mentioned vacuum condition. The connection pattern 114 has a contact area of about 10 $\mu m^2$ to about 20 $\mu m^2$. At this time, the inner pressure is concentrated on a local portion contacting the connection pattern 114, and the inner pressure is transmitted to the organic EL layer 134 through the second electrode 136.

Meanwhile, the second electrode 136 is commonly formed by a thermal evaporation method, and the second electrode 136 may have a very rough surface and a low film density. Thus, the second electrode 136 may be deformed or damaged due to the connection pattern 114 contacting the surface of the second electrode 136, more particularly, the pressure from the connection pattern 114.

Moreover, the deformation of the second electrode 136 causes transformation of the organic EL layer 134. The physical transformation of the organic EL layer 134 brings about stress on a surface of the organic EL layer 134 and changes in molecular structures. Therefore, the organic EL layer 134 may be degraded and characteristics of the organic EL layer 134 may be lowered.

SUMMARY OF THE INVENTION

By way of introduction only, in one embodiment, a dual panel-type organic electroluminescent display device comprises a first substrate having gate and data lines crossing each other thereon to define sub-pixels. An array element is disposed on the first substrate at at least one of the sub-pixels. A second substrate opposes the first substrate. A first electrode is disposed on substantially an entire surface of the second substrate. An insulating pattern is disposed on the first electrode at the at least one of the sub-pixels. An organic electroluminescent layer is disposed on the first electrode within the at least one of the sub-pixels. A second electrode is disposed on the organic electroluminescent layer at the at least one of the sub-pixels. A connection pattern electrically connects the array element and the second electrode. The connection pattern has a contact area contacting the second electrode. The insulating pattern is between the first and second electrodes at the contact area.

In another embodiment, a method for manufacturing a dual panel-type organic electroluminescent display device comprises: forming gate and data lines crossing each other on a first substrate to define sub-pixels, forming an array element at at least one of the sub-pixels on the first substrate, the array element including a switching thin film transistor and a driving thin film transistor; forming a first electrode on substantially an entire surface of a second substrate; forming an insulating pattern on the first electrode at the at least one of the sub-pixels; forming organic electroluminescent layers on the first electrode within the at least one of the sub-pixels; forming a second electrode on the organic electroluminescent layer at the at least one of the sub-pixels; forming a connection pattern connected to the driving thin film transistor at the at least one of the sub-pixels; and attaching the first and second substrates such that the connection pattern contacts the second electrode on the insulating pattern.

In another embodiment, a top emitting organic electroluminescent display device comprises a first substrate having gate and data lines crossing each other thereon to define sub-pixels. An array element is disposed on the first substrate. A second substrate opposes the first substrate. A first electrode is disposed on the second substrate. An organic electroluminescent layer is disposed on the first electrode. A second electrode is disposed on the organic electroluminescent layer. A connection pattern electrically connects the array element and the second electrode. The connection pattern contacts the second electrode at a position in a sub-pixel outside of a display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiments of the present invention, an example of which is illustrated in the accompanying drawings.

Figure 1:
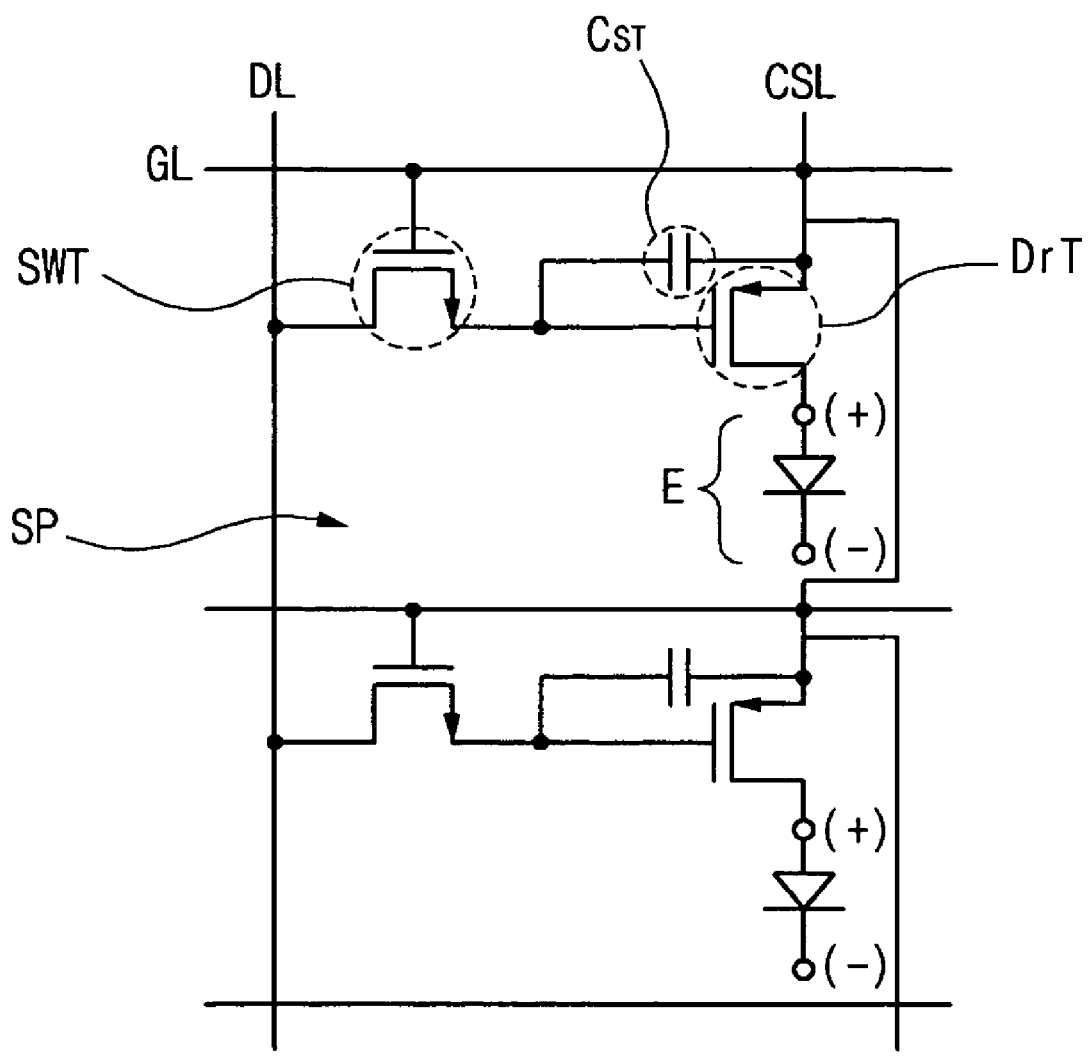
FIG. 1 is a schematic circuit diagram of a pixel structure for an active matrix-type OELD device according to the related art.
Figure 2:
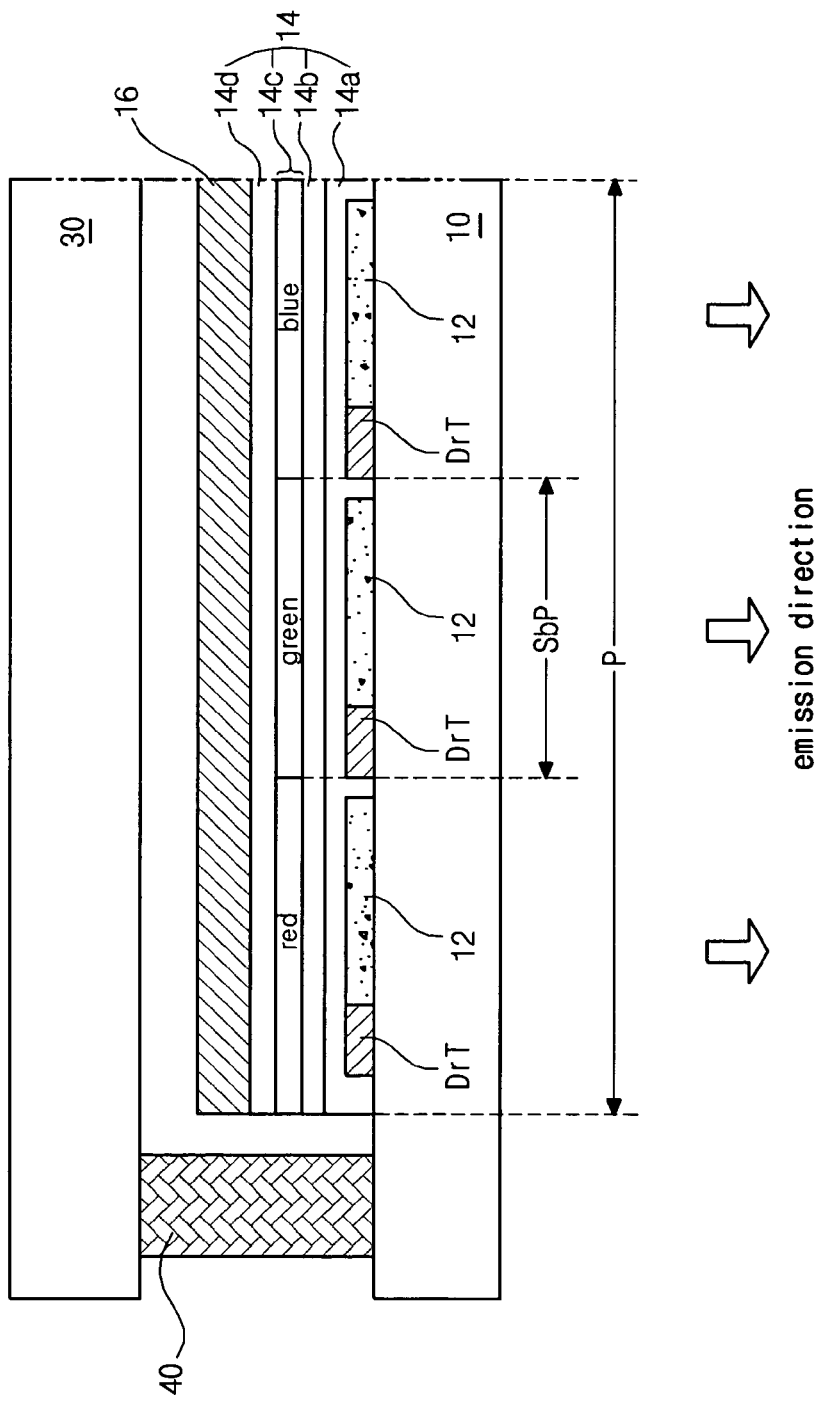
FIG. 2 is a cross sectional view of a bottom emission-type OELD device according to the related art.
Figure 3:
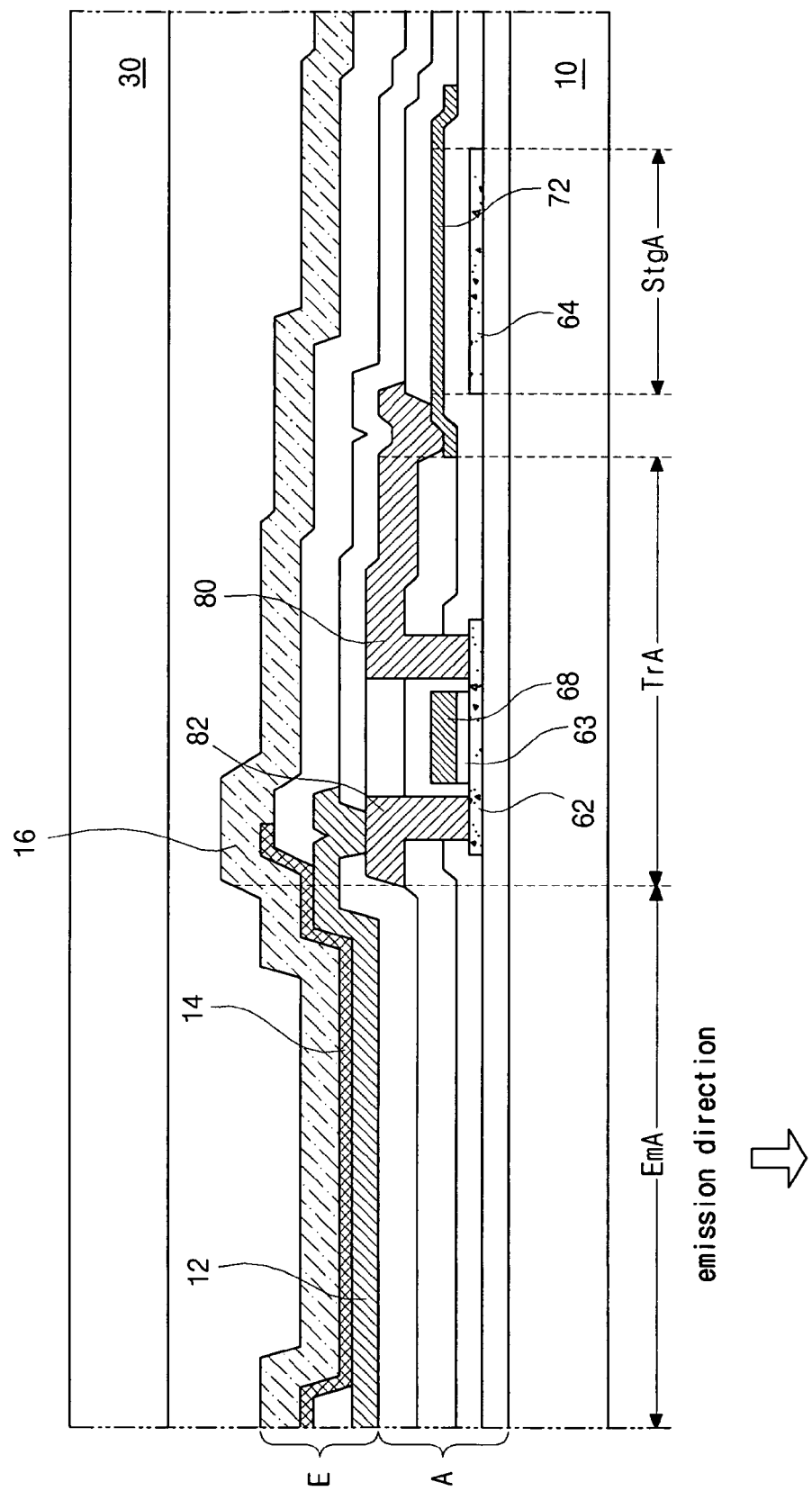
FIG. 3 is a cross sectional view of a sub-pixel region of a bottom emission-type OELD device according to the related art.
Figure 4:
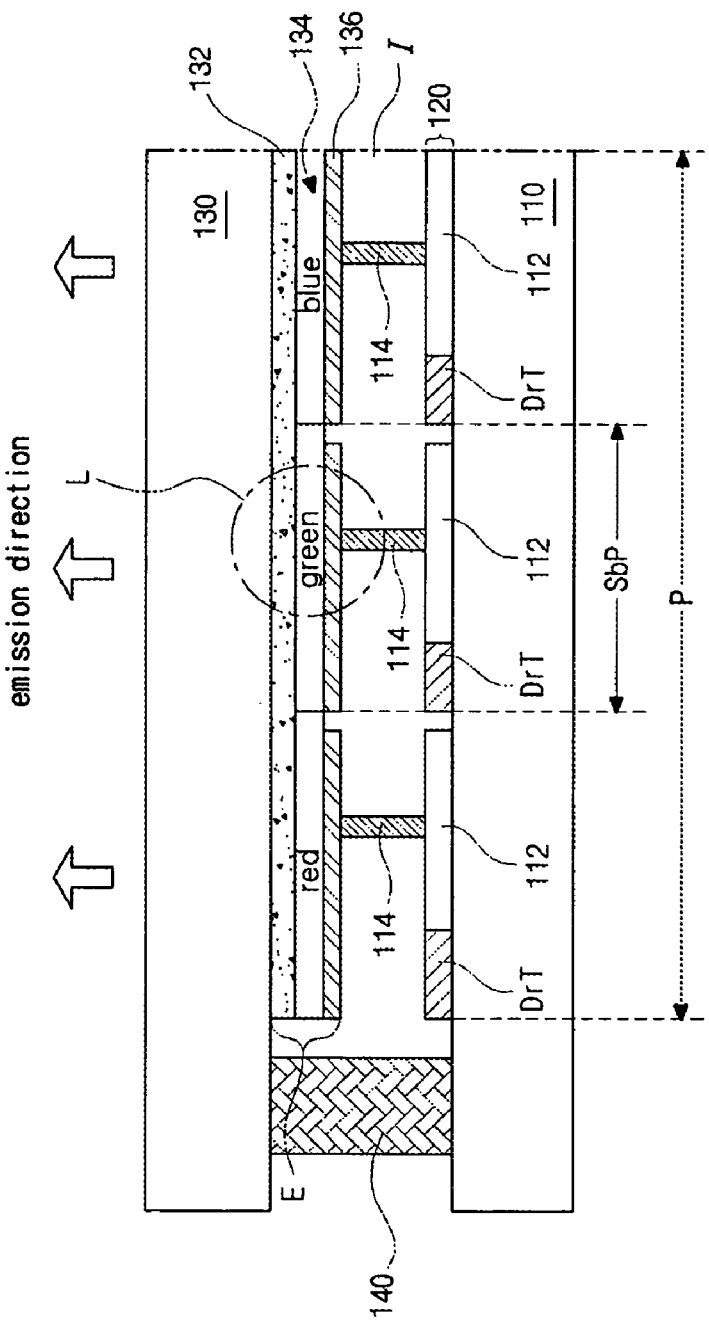
FIG. 4 is a cross sectional view of a top emission-type active matrix OELD device of the related art.
Figure 5:
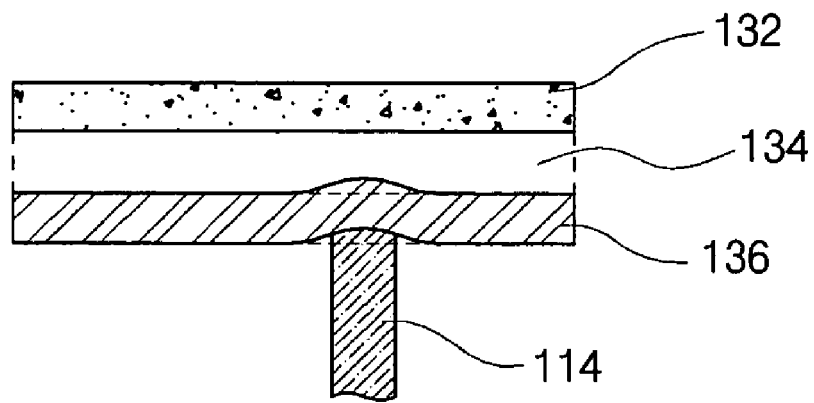
FIG. 5 is an enlarged view of the region L of FIG. 4.
Figure 6A:
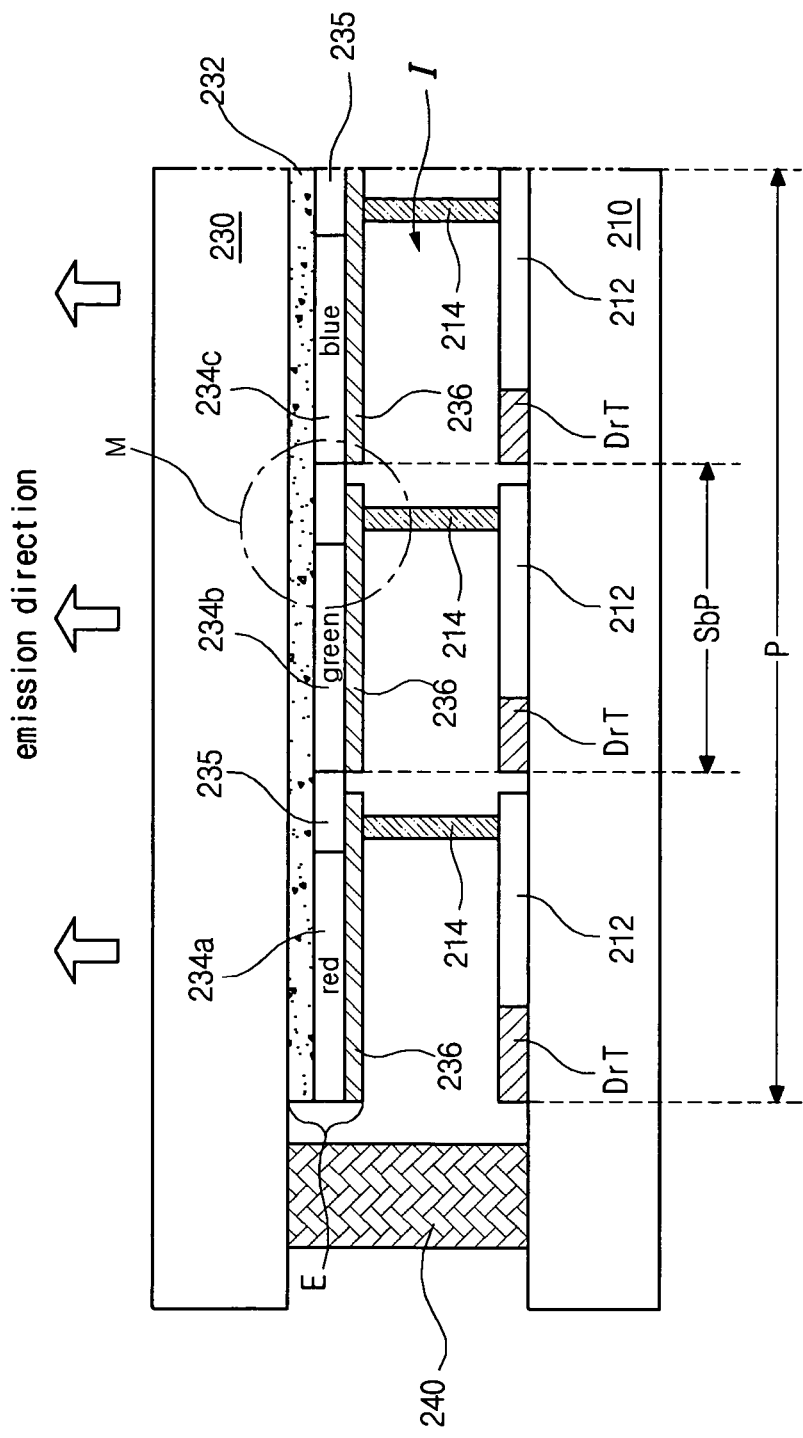
FIG. 6A is a cross sectional view of a dual panel-type OELD device according to the present invention.
Figure 6B:
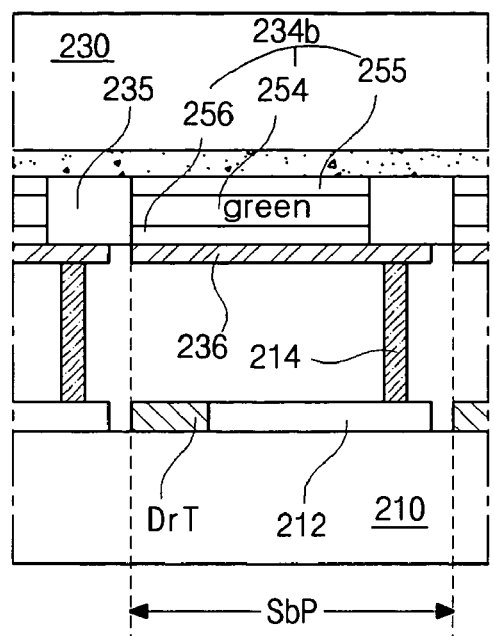
FIG. 6B is a cross sectional view of a sub-pixel for the dual panel-type OELD device.
Figure 7:
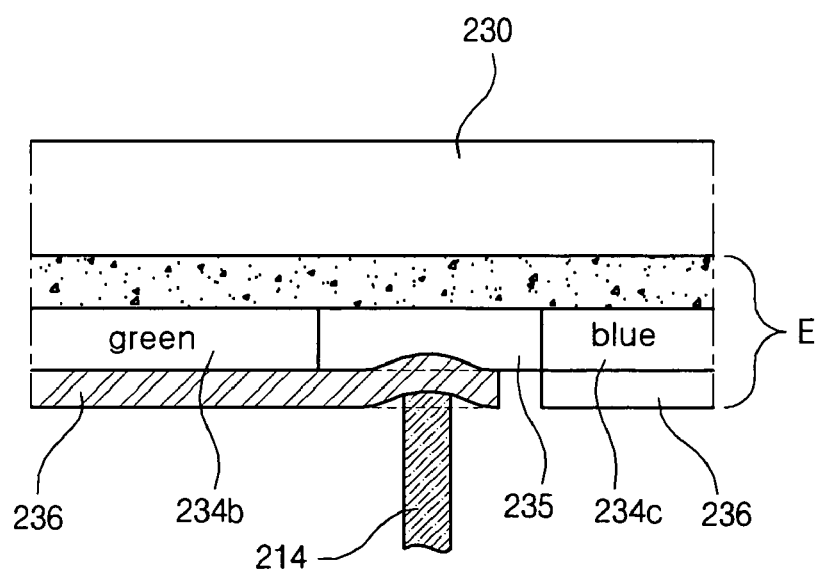
FIG. 7 is an enlarged view of the region "M" of FIG. 6A.

FIG. 6A is a cross sectional view of a dual panel-type organic electroluminescent display device according to the present invention, and FIG. 6B is a cross sectional view of a sub-pixel for the dual panel-type organic electroluminescent display device. FIG. 7 is an enlarged view of the region "M" of FIG. 6A.

As shown in the figures, a first substrate 210 and a second substrate 230 is spaced apart and bonded to each other by a seal pattern 240. Although not shown in the figures, gate and data lines are formed on an inner surface of the first substrate 210 to define sub-pixels SbP. In each sub-pixel SbP, an array element 220 is formed. The array element 220 includes at least one switching thin film transistor (TFT) (not shown) functioning as a switching element, at least one driving TFT DrT controlling an organic electroluminescent (EL) diode, and a connection electrode 212 connected to the driving TFT DrT. The connection electrode 212 may extend from a drain electrode (not shown) of the driving TFT DrT or may be a separate pattern, which is formed to be connected to the drain electrode of the driving TFT DrT.

An organic EL diode E is formed in each sub-pixel SbP on an inner surface of the second substrate 230. The organic EL diode E includes a red, green or blue organic EL layer 234a, 234b and 234c, which are sequentially arranged. The organic EL diode further includes a first electrode 232 and a second electrode 236. The first electrode 232 is formed on substantially an entire surface of the second substrate 230, each organic EL layer 234a, 234b and 234c is formed on the first electrode 232 in each sub-pixel SbP, and the second electrode 236 is formed on each organic EL layer 234a, 234b and 234c. The organic EL layer 234a, 234b and 234c and the second electrode 236 are separately formed in each sub-pixel SbP. An insulating pattern 235 is formed between adjacent organic EL layers 234a, 234b and 234c and between the first and second electrodes 232 and 236, and thus the second electrode 236 has a larger area than each organic EL layer 234a, 234b and 234c. The first electrode 232 may function as a common electrode. Thus, a display region is disposed between adjacent insulating patterns 235. An image that a user can view is disposed in the display region.

The organic EL diode E will be explained in more detail with reference to FIG. 6B. In FIG. 6B, the organic EL layer 234b is composed of an emission layer 254, a first organic layer 255 and a second organic layer 256. The emission layer 254 emits red, blue or green light and is disposed between the first organic layer 255 and the second organic layer 256. Materials for the first and second organic layers 255 and 256 are determined depending on arrangements of anode and cathode electrodes. For example, when the first electrode 232 functions as a cathode electrode and the second electrode 236 functions as an anode electrode, the first organic layer 255 includes an electron injection layer and an electron transporting layer, and the second organic layer 256 includes a hole injection layer and a hole transporting layer. On the other hand, when the first electrode 232 and the second electrode 236 function as an anode electrode and a cathode electrode, respectively, the first organic layer 255 includes a hole injection layer and a hole transporting layer, and the second organic layer 256 includes an electron injection layer and an electron transporting layer.

A connection pattern 214 is formed between the connection electrode 212 of the first substrate 210 and the second electrode 236 of the second substrate 230 to connect the second electrode 236 with the driving TFT DrT. The connection pattern 214 has a columnar shape. The connection pattern 214 is formed of a conductive material having ductility and a relatively low resistivity. Alternatively, the connection pattern 214 is formed of an organic material and a conductive material covering the organic material.

As stated above, the insulating pattern 235 is formed between adjacent organic EL layers 234a, 234b and 234c and between the first and second electrodes 232 and 236. The insulating pattern 235 corresponds to the connection pattern 214. That is, the organic EL layers 234a, 234b and 234c do not correspond to the connection pattern 214. Accordingly, although a contact pressure due to the connection pattern 214 is applied to the second electrode 236, the contact pressure has an influence on the insulating layer 235 not on the organic EL layers 234a, 234b and 234c. The organic EL layers 234a, 234b and 234c is prevented from being transformed and from being degraded, and thus a lifespan of the organic EL diode E may be increased.

Beneficially, the OELD device is a top emission-type OELD, where light from the organic EL layers 234a, 234b and 234c is emitted through the second substrate 230. Accordingly, the first electrode 232 is formed of a transparent conductive material. For example, when the first electrode 232 functions as an anode electrode, the first electrode 232 is formed of indium tin oxide (ITO) having a relatively high work function or a metal that is a few tens of angstroms (Å) thick.

When the second electrode 236 functions as a cathode electrode, the second electrode 236 may be formed of an opaque metal material having a relatively low work function, for example, aluminum (Al) or an aluminum alloy, to prevent constructive interference due to reflection of light emitted from the organic EL layers 234a, 234b and 234c.

A space I between the first and second substrates 210 and 230 is under vacuum as attachment of the first and second substrates 210 and 230 is performed under a vacuum of about $10^{-2}$ Torr to about $10^{-3}$ Torr. Although not shown in the figures, the array element 220 further includes gate and data lines crossing each other, a power supply line crossing the gate line and parallel to the data line, a switching TFT at the crossing of the gate and data lines, and a storage capacitor.

In the related art, the organic EL layer has substantially the same size as the second electrode and corresponds to the connection pattern, and the organic EL layer is influenced by a contact pressure of the connection pattern. Thus, the organic EL layer is deformed or a lifespan of the organic EL layer is decreased. Additionally, a display quality of the device may be lowered. On the other hand, in the present invention, the organic EL layer does not overlap the connection pattern, and the insulating pattern corresponds to the connection pattern. Therefore, because the organic EL layer is not influenced by the contact pressure of the connection pattern, the organic EL layer is not transformed, and the lifespan of the organic EL layer and the display quality of the device are improved.

Moreover, in the present invention, since the organic EL diode and the thin film transistor are formed on different substrates and the OELD device has a top emission-type, productivity is increased.

A method for manufacturing an organic electroluminescent display device having the above-mentioned structure will be described with reference to attached drawings.

Figure 8:
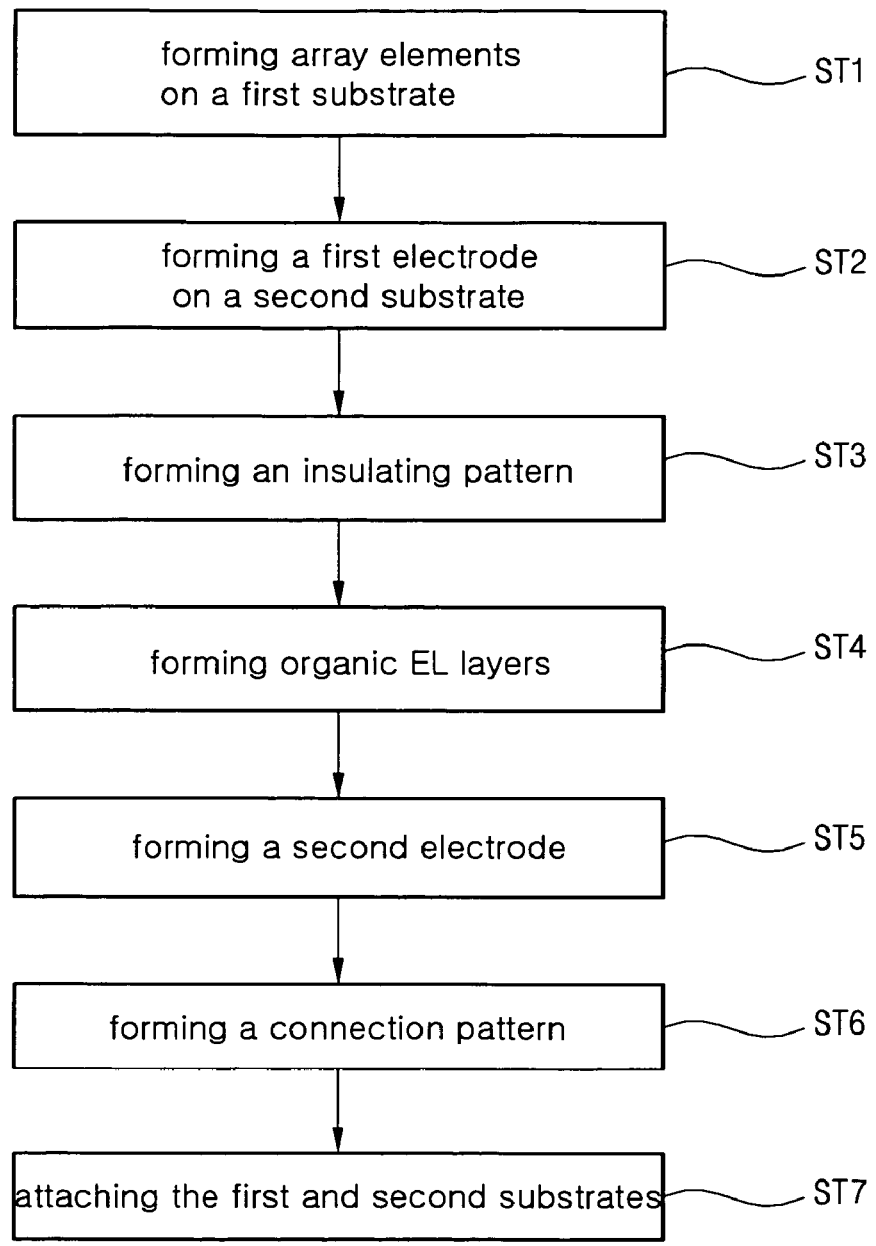
FIG. 8 is a flow chart illustrating a method for manufacturing an OELD device according to the present invention.
Figure 9:
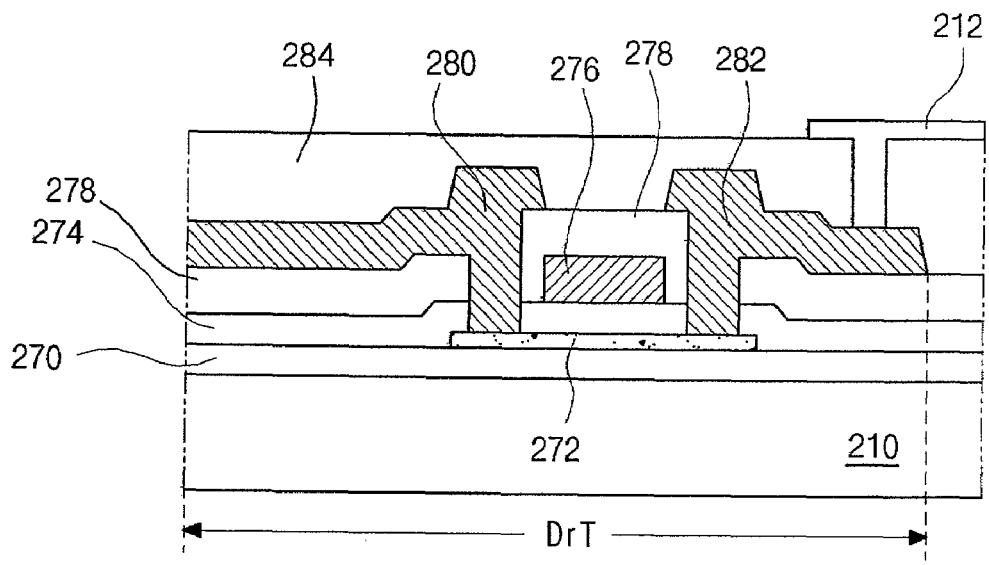
FIG. 9 is a cross sectional view of an array element on a first substrate for an OELD device according to the present invention.
Figure 10:
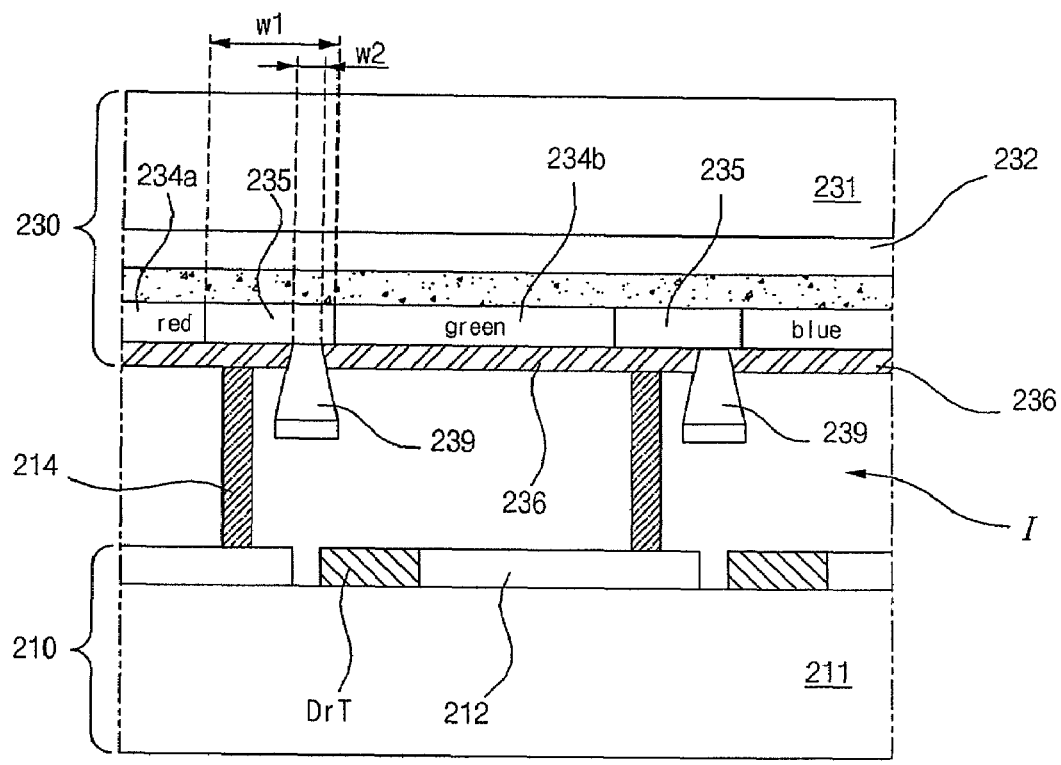
FIG. 10 is a schematic cross sectional view of an OELD device according to the present invention.

FIG. 8 is a flow chart illustrating a method for manufacturing an organic electroluminescent display (OELD) device according to the present invention. FIG. 9 is a cross sectional view of an array element on a first substrate for an OELD device according to the present invention. FIG. 10 is a schematic cross sectional view of an OELD device according to the present invention.

At step ST1, an array element is formed on a first substrate. More particularly, as shown in FIG. 9, a buffer layer 270 is formed on the first substrate 210, and a semiconductor layer 272 is formed on the buffer layer 270. A capacitor electrode (not shown) is formed on the buffer layer 270 simultaneously with the semiconductor layer 272. A gate insulating layer 274 is formed on the semiconductor layer 272, and a gate electrode 276 is formed on the gate insulating layer 274 over the semiconductor layer 272. Next, an inter insulating layer 278 is formed on the gate electrode 276, and source and drain electrodes 280 and 282 are formed on the inter insulating layer 278. The source and drain electrodes 280 and 282 are connected to both sides of the semiconductor layer 272, which are doped with impurities. A passivation layer 284 is formed on the source and drain electrodes 280 and 282, and a connection electrode 212 is formed on the passivation layer 284. The connection electrode 212 is connected to the drain electrode 212 through a contact hole formed in the passivation layer 284. The semiconductor layer 272, the gate electrode 276, and the source and drain electrodes 280 and 282 constitute a driving thin film transistor (TFT) DrT of an OELD device. A switching TFT (not shown) having the same structure as the driving TFT DrT of FIG. 9 is also formed on the first substrate 210. Additionally, a power electrode (not shown), which is connected to an electrode of the driving TFT DrT, i.e., the source electrode 280, is formed on the first substrate 210. The power electrode overlaps the capacitor electrode with an insulating layer therebetween to thereby form a storage capacitor.

In present invention, the driving TFT DrT and the switching TFT have a top gate structure in which the semiconductor layer 272 is formed of polycrystalline silicon. However, the driving TFT DrT and the switching TFT may have a bottom gate structure in which the gate electrode is formed directly on the substrate. In this case, the semiconductor layer may be formed of amorphous silicon or polycrystalline silicon.

At step ST2, a first electrode 232 is formed on substantially an entire surface of a second substrate 230. Therefore, it is possible to choose various materials for the first electrode 232, and it is simple to perform the processes. The first electrode 232 is beneficially formed of a transparent conductive material having a relatively high work function.

At step ST3, an insulating pattern 235 is formed on the first electrode 232. The insulating pattern 235 corresponds to a region where a connection pattern 214 is formed. The connection pattern 214 connects the connection electrode 212 of the first substrate 210 with a second electrode of the second substrate 230 to be formed later. The connection pattern 214 has the same area as or a larger area than the region where the connection pattern 214 is formed by considering an attaching margin.

Meanwhile, a partition wall 239 may be formed on the insulating pattern 235. In this case, the partition wall 239 may be formed along peripheral portions of the sub-pixel. The insulating pattern 235 has the same shape as and a larger size w1 than the partition wall 239. The insulating pattern 235 may be formed in a portion corresponding to either a vertical part or a horizontal part of the partition wall 239 or may be formed only in a portion corresponding to the connection pattern 214. The insulating pattern 235 may be formed of an inorganic material and may be formed in an expected region by using a shadow mask.

Additionally, at step ST3, the partition wall 239 is formed on the insulating pattern 235. The partition wall 239 may have a matrix form surrounding the sub-pixel or may have a line shape disposed between vertically adjacent sub-pixels or between horizontally adjacent sub-pixels. As stated above, the partition wall 239 has a smaller size w2 than the insulating pattern 235.

At step ST4, organic EL layers 234a, 234b and 234c of red, green and blue are sequentially formed on the first electrode 232. The organic EL layers 234a, 234b and 234c may be formed by an inkjet method, a nozzle coating method or a deposition method using a shadow mask. The organic EL layers 234a, 234b and 234c may be separate patterns corresponding respective sub-pixels or may be a line shape connecting layers in adjacent same color sub-pixels. The organic EL layers 234a, 234b and 234c are not formed in a region where the insulating pattern 235 is formed. Therefore, the insulating layer 235 is disposed between adjacent organic EL layers 234a, 234b and 234c.

Each organic EL layer 234a, 234b and 234c may include an emission layer, a hole injection layer, a hole transporting layer, an electron injection layer, and an electron transporting layer.

At step ST5, a second electrode 236 is formed on each organic EL layer 234a, 234b and 234c. The second electrode 236 may be separately formed at each sub-pixel by using a shadow mask such that the second electrode 236 covers one of the organic EL layer 234a, 234b and 234b and the insulating pattern 235. On the other hand, when the partition wall 239 is formed in a matrix form, the second electrode 236 may be separately formed due to the partition wall 239 by depositing on a substantially entire surface of the second substrate 230. The second electrode 236 may be formed of an opaque metal material having a relatively low work function.

At step ST 6, the connection pattern 214 is formed to electrically connect the first and second substrates 210 and 230, more particularly, the driving TFT DrT and the second electrode 236. The connection pattern 214 may be formed on one of the first and second substrates 210 and 230. That is, the connection pattern 214 may be formed on the connection electrode 212 of the first substrate 210 or may be formed on the second electrode 236 of the second substrate 230 such that the connection pattern 214 corresponds to the insulating pattern 235.

In one embodiment, to prevent damage of the organic EL layer 234a, 234b and 234c, the connection pattern 214 is formed on the first substrate 210. Explanation for a case that the connection pattern 214 is formed on the first substrate 210 follows.

The connection pattern 214 is formed on the connection electrode 212, which is connected to the drain electrode (not shown) of the driving TFT DrT, and contacts the connection electrode 212. The connection pattern 214 has a predetermined thickness such that a gap between the first and second substrates 210 and 230 is kept uniform. Thus, the connection pattern 214 may be formed by depositing a metal material to have a certain thickness on an entire surface of the first substrate 210 and then patterning the metal material through a mask process, which includes coating photoresist, exposing the photoresist using a mask, developing the exposed photoresist, and etching the metal material. The connection pattern 214 of one embodiment has a contact area of about 10 $\mu m^2$ to about 20 $\mu m^2$. If the connection pattern 214 has a larger contact area, the aperture ratio of the sub-pixel is further decreased.

At step ST7, the first and second substrates 210 and 230 are attached. First, a seal pattern (not shown) is formed on one of peripheral portions of the first and second substrates 210 and 230. Next, the first and second substrates 210 and 230 are arranged to face each other under a vacuum of about $10^{-2}$ Torr to about $10^{-3}$ Torr such that the connection pattern 214 contacting the connection electrode 212 corresponds to the second electrode 236 on the insulating layer 235. The first and second substrates 210 and 230 are attached by using the seal pattern on the peripheral portions of the first and second substrates 210 and 230 to complete an organic electroluminescent display (OELD) device. The connection pattern 214 overlaps the insulating pattern 235. In addition, at the step ST7, a desiccant is formed inside the OELD device to prevent moisture from permeating into the OELD device.

Figure 11:
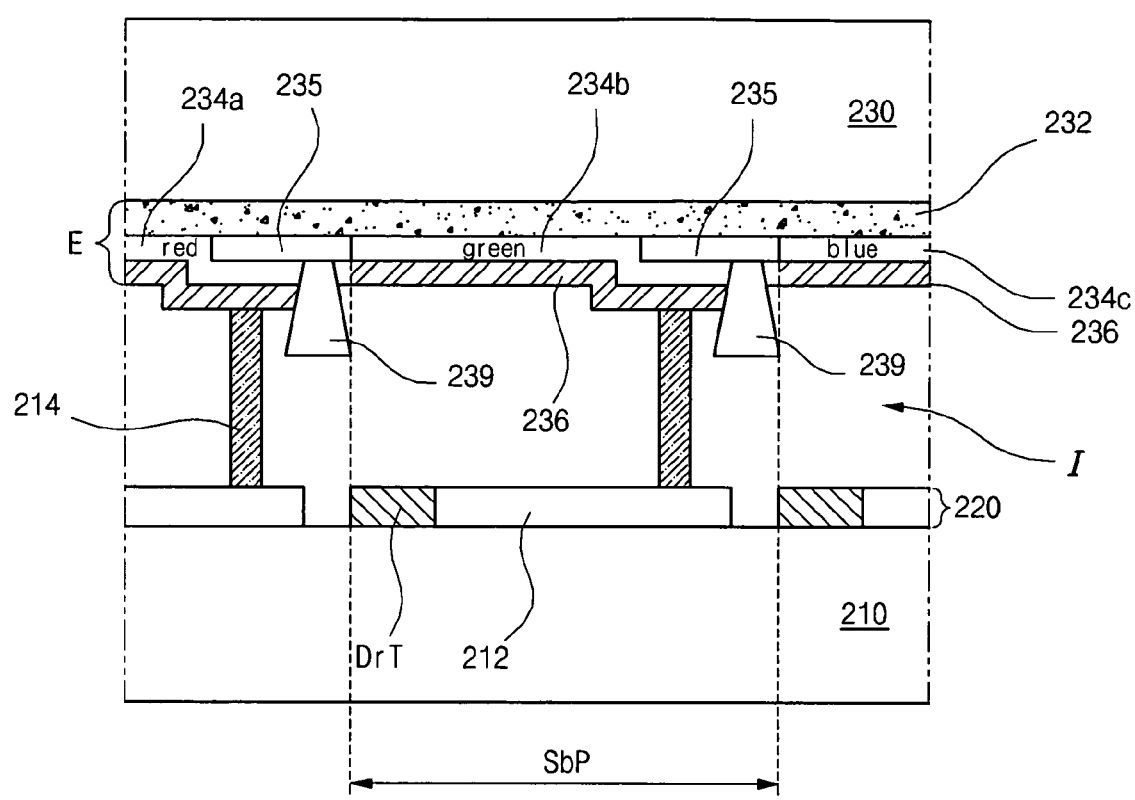
FIG. 11 is a schematic cross sectional view of another embodiment of an OELD device.

FIG. 11 shows yet another embodiment of the OELD device. Similar to the other embodiments, a first substrate 210 and a second substrate 230 are spaced apart and bonded to each other by a seal pattern (240 of FIG. 6A). Gate and data lines are formed on an inner surface of the first substrate 210 to define sub-pixels SbP. In each sub-pixel SbP, an array element 220 is formed. The array element 220 includes at least one switching thin film transistor (TFT) (not shown) functioning as a switching element, at least one driving TFT DrT controlling an organic electroluminescent (EL) diode, and a connection electrode 212 connected to the driving TFT DrT. The connection electrode 212 may extend from a drain electrode (not shown) of the driving TFT DrT or may be a separate pattern, which is formed to be connected to the drain electrode of the driving TFT DrT.

An organic EL diode E is formed in each sub-pixel SbP on an inner surface of the second substrate 230. The organic EL diode E includes a red, green or blue organic EL layer 234a, 234b and 234c, which are sequentially arranged. The organic EL diode further includes a first electrode 232 and a second electrode 236. The first electrode 232 is formed on substantially an entire surface of the second substrate 230, each organic EL layer 234a, 234b and 234c is formed on the first electrode 232 in each sub-pixel SbP, and the second electrode 236 is formed on each organic EL layer 234a, 234b and 234c. The first electrode 232 may function as a common electrode. The organic EL layer 234a, 234b and 234c and the second electrode 236 are separately formed in each sub-pixel SbP. An insulating pattern 235 and a partition wall 239 formed on the insulating pattern 235 are formed in each sub-pixel SbP.

As shown, the partition wall 239 is formed along peripheral portions of the sub-pixel. As shown in FIG. 11, the partition wall 239 is disposed adjacent to, but not over the insulating pattern 235, although in other embodiments similar to FIG. 10, the partition wall 239 may be disposed over the insulating pattern 235. The partition wall 239 separates both adjacent second electrodes 236 and adjacent organic EL layers 234a, 234b and 234c. That is, unlike the embodiment shown in FIG. 10, the organic EL layer 234a, 234b and 234c does not terminate at the insulating pattern 235. Instead, the organic EL layer 234a, 234b and 234c extends over the insulating pattern 235 into the area in which the connection pattern 214 contacts the second electrode 236. Although the organic EL layer 234a, 234b and 234c extends into the point of the contact, the insulating pattern 235 therebelow functions as a buffer layer and thus may effectively decrease stress on the organic EL layer 234a, 234b and 234c. Moreover, although this may adversely affect the characteristics of the organic EL layer 234a, 234b and 234c lying between the point of contact and the insulating pattern 235, as the insulating pattern 235 may be opaque, the area in which the organic EL layer 234a, 234b and 234c is affected lies in a non-display region of the sub-pixel, i.e. a region outside of the display region of the sub-pixel in which the user can view the image. Moreover, since the organic EL layer 234a, 234b and 234c has a step due to the insulating pattern 235, stress and adversely affecting thereon may effectively be decrease.

As in the embodiment of FIG. 10, the insulating pattern 235 has the same shape as and a larger size than the partition wall 239. The insulating pattern 235 may be formed in a portion corresponding to either a vertical part or a horizontal part of the partition wall 239 or may be formed only in a portion corresponding to the connection pattern 214. The insulating pattern 235 may be formed of an inorganic material and may be formed in an expected region by using a shadow mask.

Similarly, the connection pattern 214 is formed of a conductive material having ductility and a relatively low resistivity. Alternatively, the connection pattern 214 is formed of an organic material and a conductive material covering the organic material. When the second electrode 236 functions as a cathode electrode, the second electrode 236 may be formed of an opaque metal material having a relatively low work function, for example, aluminum (Al) or an aluminum alloy, to prevent constructive interference due to reflection of light emitted from the organic EL layers 234a, 234b and 234c.

According to the present invention, since the organic EL diode and the thin film transistors are formed on different substrates, productivity and production control efficiency of the device may be improved. In addition, the organic EL layer does not overlap the connection pattern connecting the organic EL diode and the thin film transistor, and thus the organic EL layer is prevented from being damaged due to contact pressure of the connection pattern. Accordingly, a lifetime of the organic EL diode may be increased. Moreover, since the OELD device is a top emission-type, the thin film transistor may be easily designed, and a high aperture ratio and a high image resolution may be achieved.

It will be apparent to those skilled in the art that various modifications and variations can be made in the organic electroluminescent display device and the method of fabricating the organic electroluminescent display device of the present invention without departing from the spirit or scope of the inventions. Thus, it is intended that the present invention covers the modifications and variations of this invention provided they come within the scope of the appended claims and their equivalents.

What is claimed is:

1. A dual panel-type organic electroluminescent display device, comprising:
    a first substrate having gate and data lines crossing each other thereon to define sub-pixels;
    an array element disposed on the first substrate at at least one of the sub-pixels;
    a second substrate opposing the first substrate;
    a first electrode disposed on substantially an entire surface of the second substrate
    an insulating pattern disposed on the first electrode at the at least one of the sub-pixels;
    an organic electroluminescent layer disposed on the first electrode within the at least one of the sub-pixels;
    a second electrode disposed on the organic electroluminescent layer at the at least one of the sub-pixels; and
    a connection pattern electrically connecting the array element and the second electrode and having a contact area contacting the second electrode, the insulating pattern between the first and second electrodes at the contact area,
    wherein the organic electroluminescent layer is not disposed between the first and second electrodes at the position where the connection pattern contacts the second electrode, and wherein the organic electroluminescent layer and the insulating pattern wherein the organic electroluminescent layer and the insulating pattern are entirely disposed at the same layer and have substantially the same thickness to form a flat surface.

2. The device according to claim 1, wherein the array element includes a connection electrode contacting the connection pattern.

3. The device according to claim 2, wherein the array element includes a switching thin film transistor and a driving thin film transistor.

4. The device according to claim 3, wherein the connection electrode is connected to a drain electrode of the driving thin film transistor.

5. The device according to claim 3, wherein the connection electrode extends from a drain electrode of the driving thin film transistor.

6. The device according to claim 1, wherein the insulating pattern has a first width and has a matrix form.

7. The device according to claim 6, further comprising a partition wall on the insulating pattern, the partition wall having a second width narrower than the first width of the insulating pattern to expose a portion of the insulating pattern inside the sub-pixel.

8. The device according to claim 7, wherein the second electrode covers the portion of the insulating pattern inside the sub-pixel.

9. The device according to claim 8, wherein the portion of the insulating pattern inside the sub-pixel is wider than the contact area of the connection pattern.

10. The device according to claim 1, wherein the insulating pattern has a larger size than the contact area of the connection pattern.

11. The device according to claim 1, wherein the contact area of the connection pattern is within a range of about 10 $\mu m^2$ to about 20 $\mu m^2$.

12. The device according to claim 1, wherein the connection pattern is formed of a ductile conductive material.

13. The device according to claim 1, wherein the connection pattern is formed of an organic material and a conductive material covering the organic material.

14. The device according to claim 1, wherein the first electrode has a work function higher than the second electrode and is formed of a transparent conductive material.

15. The device according to claim 1, wherein the second electrode has a work function smaller than the first electrode and is formed of an opaque conductive material.

16. The device according to claim 1, wherein an organic electroluminescent layer is disposed within each sub-pixel, each organic electroluminescent layer includes a hole injection layer, a hole transporting layer, an electron injection layer, an electron transporting layer, and a red, green or blue emission layer.

17. The device according to claim 1, further comprising a seal pattern on a peripheral portion of the first and second substrates.

18. The device according to claim 1, wherein the organic electroluminescent layer is disposed between the insulating pattern and the connection pattern.

19. A dual panel-type organic electroluminescent display device, comprising:
    a first substrate having gate and data lines crossing each other thereon to define sub-pixels;
    an array element disposed on the first substrate;
    a second substrate opposing the first substrate;
    a first electrode disposed on the second substrate;
    an organic electroluminescent layer disposed on the first electrode;
    a second electrode disposed on the organic electroluminescent layer; and a connection pattern electrically connecting the array element and the second electrode, the connection pattern contacting the second electrode at a position in a sub-pixel outside of a display region, wherein the organic electroluminescent layer is not disposed between the first and second electrodes at the position where the connection pattern contacts the second electrode, and wherein the organic electroluminescent layer and the insulating pattern are entirely disposed at the same layer and have substantially the same thickness to form a flat surface.

20. The device according to claim 19, wherein an array element, a first electrode, an organic electroluminescent layer, a second electrode, and a connection pattern are disposed at each sub-pixel.

21. The device according to claim 20, wherein adjacent second electrodes are separated by a vacuum.

22. The device according to claim 20, further comprising an insulating partition wall separating adjacent second electrodes.

23. The device according to claim 22, wherein the connection pattern is adjacent to the insulating partition wall.

24. The device according to claim 20, wherein adjacent array elements are separated by a vacuum.

25. The device according to claim 19, wherein the array element includes a switching thin film transistor and a driving thin film transistor, and the connection electrode is connected to a drain electrode of the driving thin film transistor.

26. The device according to claim 19, wherein the connection pattern is formed of a ductile conductive material.

27. The device according to claim 19, wherein the connection pattern is formed of an organic material and a conductive material covering the organic material.

28. The device according to claim 19, wherein the first electrode has a work function higher than the second electrode and is formed of a transparent conductive material.

29. The device according to claim 19, further comprising a seal pattern on a peripheral portion of the first and second substrates.

30. The device according to claim 19, wherein the second electrode has a work function smaller than the first electrode and is formed of an opaque conductive material.

31. The device according to claim 19, wherein the organic electroluminescent layer is disposed between the insulating pattern and the connection pattern.

* * * * *

UNITED STATES PATENT AND TRADEMARK OFFICE
CERTIFICATE OF CORRECTION

PATENT NO. : 7,683,538 B2
APPLICATION NO. : 11/158115
DATED : March 23, 2010
INVENTOR(S) : Choong-Keun Yoo et al.

It is certified that error appears in the above-identified patent and that said Letters Patent is hereby corrected as shown below:

In the Claims

In column 11, claim 1, lines 49-50, delete "wherein the organic electroluminescent layer and the insulating pattern" (second occurrence).

Signed and Sealed this

Twenty-seventh Day of July, 2010

David J. Kappos
*Director of the United States Patent and Trademark Office*